United States Patent [19]

Heremans et al.

[11] Patent Number: 5,871,888
[45] Date of Patent: Feb. 16, 1999

[54] METHOD OF FORMING MULTIPLE-LAYER MICROLENSES AND USE THEREOF

[75] Inventors: Paul Heremans, Louvain; Gustaaf Borghs, Kessel-Lo, both of Belgium

[73] Assignee: IMEC vzw, Louvain, Belgium

[21] Appl. No.: 680,201

[22] Filed: Jul. 11, 1996

Related U.S. Application Data

[60] Provisional application No. 60/001,023 Jul. 11, 1995.

[51] Int. Cl.⁶ ........................................................ G03F 7/00
[52] U.S. Cl. .............................. 430/321; 430/330; 216/26
[58] Field of Search ..................................... 430/311, 320, 430/321, 322, 330; 216/26; 250/208.1

[56] References Cited

U.S. PATENT DOCUMENTS

| | | | |
|---|---|---|---|
| 4,689,291 | 8/1987 | Popovic et al. | 430/394 |
| 5,286,605 | 2/1994 | Nishioka | 430/311 |
| 5,605,783 | 2/1997 | Revelli | 430/321 |

FOREIGN PATENT DOCUMENTS 4-239781   8/1992   Japan .

OTHER PUBLICATIONS

"A Process for Monolithic Fabrication of Microlenses on Integrated Circuits," Popovic, Z., *SPIE*, vol. 898 Optics and Lasers, pp. 23–25, 1988.

"Fabrication of Complex Micro–Optic Components using Photo–Sculpting through Halftone Transmission Masks," Purdy, D., *Pure Appl. Opt. 3.*, pp. 167–175, 1994.

"Polymer Microlens Arrays," Pantelis, et al., *Pure Appl. Opt. 3.*, pp. 103–108, 1994.

"Tolerancing of Arrays of Microlens Relays: A Case Study," Prince, et al., *Pure Appl. Opt. 3*, pp. 151–165, 1994.

"Microlenses fabricated by Melting a Photoresist on a Base Layer," Haselbeck, et al., *Optical Engineering 32(6)*, pp. 1322–1324, 1993.

*Primary Examiner*—Kathleen Duda
*Attorney, Agent, or Firm*—Knobbe, Marten, Olson & Bear LLP

[57] ABSTRACT

A method of forming refractive microlenses which includes the steps of depositing or growing a first transparent layer on a substrate; depositing or growing a second transparent layer on the first transparent layer; forming a columnar structure in the second transparent layer; forming a pillar in the first transparent layer using the columnar structure as a mask, whereby the pillar is self-aligned under the columnar structure and the pillar has a cross-sectional area smaller than or equal to the cross-sectional area of the columnar structure; thereafter reflowing the second transparent layer of the columnar structure while the pillar remains essentially unaltered, whereby a structure is formed on top of the pillar, the structure having a ground plane with an area smaller than or equal to the original cross-sectional area of the columnar structure; and solidifying said structure. Due to the surface tension, the pillar underneath the microlens confines the reflow of the microlens to an area smaller or equal to the original cross-sectional area of the lens-forming columnar structure. A major effect of this is that the microlens has a strong curvature, and hence, a large numerical aperture.

27 Claims, 22 Drawing Sheets

(11)　　　　　　　　　　　　　　(12)

(11)　(13)　　　　　　　　(14)　(12)

SMALL NA

| HEIGHT ABOVE EMITTER (IN MICRON) | MAXIMUM ANGLE OBTAINABLE | MAXIMUM EFFICIENCY | EFFICIENCY WITHIN 10deg |
|---|---|---|---|
| NO LENS | 90 | 1.59% | 0.052% |
| IMPLEMENTATION BY HASELBECK | 82 | 1.80% | 0.052% |
| 376 | 19.9 | 0.50% | 0.128% |
| 476 | 13.6 | 0.33% | 0.176% |
| 576 | 9.30 | 0.228% | 0.228% |
| 676 | 6.20 | 0.168% | 0.168% |

FIG. 11

| HEIGHT ABOVE EMITTER (in μm) | MAXIMUM ANGLE OBTAINABLE | MAXIMUM EFFICIENCY | EFFICIENCY WITHIN 10deg |
|---|---|---|---|
| NO LENS | 90 | 1.59% | 0.052% |
| 15 | 44 | 2.12% | 0.13% |
| 26 | 20.9 | 1.08% | 0.26% |
| 33 | 10.9 | 0.72% | 0.58% |
| 36 | 7.63 | 0.606% | 0.606% |
| 43 | 2.09 | 0.456% | 0.456% |
| 49 | 3.38 | 0.36% | 0.36% |
| 58 | 7.80 | 0.25% | 0.25% |

FIG. 13

CONFIGURATION

| H/R | MAXIMUM ANGLE OBTAINABLE | MAXIMUM EFFICIENCY | EFFICIENCY WITHIN 10deg |
|---|---|---|---|
| NO LENS | 90 | 1.59% | 0.052% |
| 0.0 | 90 | 4.253% | 0.13% |
| 0.5 | 66.9 | 4.253% | 0.265% |
| 0.625 | 38.7 | 4.125% | 0.339% |
| 0.80 | 15.6 | 2.510% | 0.548% |
| 0.90 | 10.8 | 1.97% | 1.31% |
| 0.92 | 10.0 | 1.89% | 1.89% |
| 0.95 | 8.96 | 1.75% | 1.75% |
| 1.00 | 7.50 | 1.59% | 1.59% |
| 58 | 7.80 | 0.25% | 0.25% |

| LENS | MAXIMUM ANGLE OBTAINABLE | MAXIMUM EFFICIENCY | EFFICIENCY WITHIN 10deg |
|---|---|---|---|
| NO LENS | 90 | 1.59% | 0.052% |
| example 1 | 8.53 | 1.05% | 1.05% |
| example 2 | 11.87 | 0.68% | 0.657% |
| example 3 | 20.7 | 1.95% | 0.265% |
| example 4 | 9.95 | 1.16% | 1.16% |
| sphere H/R=092 | 10 | 1.89% | 1.89% |

METHOD OF FORMING MULTIPLE-LAYER MICROLENSES AND USE THEREOF

This application claims the benefit of Provisional Application No. 06/001,023 filed on Jul. 11, 1995.

BACKGROUND OF THE INVENTION

1. Field of the Invention

The present invention relates to the fabrication of refractive microlenses. More specifically, a method of forming microlenses self-aligned on a resin pillar is proposed.

2. Description of the Related Technology

Microlenses are microscopic passive optical components that fit on active optoelectronic devices such as detectors, displays, and light emitting devices (light-emitting diodes, transversal and vertical cavity lasers) to improve their optical input or output quality. The areas of applications are wide and cover areas such as telecommunications, information technology, audio-visual services, solar cells, detectors, solid-state light sources, and optical interconnects.

There are basically two types of micro-lenses: diffractive lenses and refractive lenses. A diffractive microlens deflects a light beam by diffraction. It typically consists of single-level or multilevel concentric rings sculptured in a material with refractive index different from the environment.

A refractive microlens deflects a light beam by refraction at its curved surfaces. It is mostly plano-convex: one surface of the microlens is planar, while the other is curved. Refractive microlenses and microlens arrays are available in a variety of organic and inorganic materials, including resins such as photoresist, dielectric materials such as glasses, and semiconductors such as silicon and GaAs. The curvature can be obtained by a wide variety of techniques.

The prior art describes several techniques that produce high-quality diffraction-limited refractive microlenses. Overview articles have been published by P. Pantelis et al., "Polymer microlens arrays", Pure Appl. Opt. 3, pp. 103–108 (1994), and by D. R. Purdy, "Fabrication of complex micro-optic components using photo-sculpting through halftone transmission masks", Pure Appl. Opt. 3, pp. 167–175, (1994).

A particular class of techniques concentrates on forming microlenses in thermoplastic resins like photoresist. An example is published by Popovic et al. in the reference SPIE 898, pp.23–25 (1988). The technique, named reflow technique, comprises the steps of defining the lenses' footprint in a thermoplastic resin, e.g. by photolithography in a photosensitive resin like photoresist, and subsequently heating this material above its reflow temperature. The surface tension draws the island of photoresist into a spherical cap with a volume equal to the original island before reflow. This cap is a plano-convex microlens. Advantages of the technique are, amongst others, the simplicity, the reproducibility, the possibility of integration directly on top of a light-emitting or light-detecting optoelectronic device. The maximum achievable diameter of such lens is limited to approximately 700 $\mu$m: a larger island of photoresist does not reflow into a spherical cap but sags in the middle.

Other prior art techniques improve the mechanical strength and chemical stability of photoresist lenses, which improve their market value. One possibility is to transfer the lens shape into the substrate material by etching. Another solution is the use of negative photoresists instead of positive photoresists, as they are chemically more stable. Yet another possibility is implantation of Si to bring the resin material to cross-linking to become insoluble.

A drawback of said reflow technique is that the portion of the sphere which is obtained is always substantially smaller than a hemisphere. In other words, the cap height is much smaller than the radius of curvature. This is due to the limited aspect ratio of the photoresist island before reflow. The limited ratio of peak height to radius of the lens means that such lens is not suited for improving the light output of solid-state light-emitters like planar light-emitting diodes which have a Lambertian emission profile (i.e., they emit light in all directions). Indeed, the optimum lens shape for this purpose is an almost complete sphere, or, even better, an ellipsoid with the long axis perpendicular to the light-emitting surface. Such shapes cannot be made with prior-art photoresist reflow techniques.

In U.S. Pat. No. 4,689,291 a method has been proposed to improve the repeatability of the reflow technique by confining the reflow to a pedestal formed prior to the microlens fabrication. This method is also described in above-mentioned reference Popovic et al., SPIE 898, PP. 23–25 (1988). Lenses formed according to this method have an improved ratio of peak height to radius, and hence are better suited for integration on light emitters. As shown in FIG. 2 of said reference, the shape of the lens obtained in this way is, however, still far from hemispherical.

SUMMARY OF THE INVENTION

The present invention provides a method for fabricating microlenses suited for integration on light emitters. The microlenses fabricated according to this method have an enhanced external quantum efficiency and improved directivity of the emitted light.

The present invention also provides a method of forming a refractive microlens consisting of a pillar with an ellipsoidally-shaped dome. This microlens is formed as follows. At least one layer of a first, pillar-forming, resin material (1) is deposited prior to deposition of at least one layer of a second, microlens-forming, thermoplastic resin (2) such as a positive photoresist. Said first transparent layer can be $SiO_2$ or $Si_3N_4$ or ZnSe or $InSnO_x$. Said first transparent layer can also be a resin or a photoresist or polyimide. A columnar structure (3) is formed in the microlens-forming resin, and the pillar-forming resin material is patterned with this columnar structure (3) as a mask. In this way a pillar (4) is formed in the first resin material which is properly self-aligned underneath the columnar structure (3), and such that the cross-sectional area of the pillar (4) is smaller than or equal to the cross-sectional area of the columnar structure (3). Thereafter, a microlens (5) is formed from the columnar structure of thermoplastic lens-forming resin. This can be achieved by heating the structure above the reflow temperature of the thermoplastic lens-forming resin and subsequently cooling it down again to solidify the lens. Due to the surface tension, the pillar (4) underneath the microlens (5) confines the reflow of the microlens to an area smaller or equal to the original cross-sectional area of the lens-forming columnar structure. The lens shape is in general part of an ellipsoid with two longer axis parallel to the surface and a shorter axis perpendicular to it. It is to be understood that the terms ellipsoid or ellipsoid shape or ellipsoid-like shape mean part of an ellipsoid. It is feasible to achieve a lens shape with all three axis having the same length rendering the microlens shape spherical. With some thermoplastic resins where the amount of reflow can be precisely controlled, an ellipsoid having the axis perpendicular to the surface longer than the axis parallel to the surface may be obtained.

Spin coating and photolithography may be employed to form the columnar structure from the thermoplastic lens-forming resin. It should be understood, however, that other deposition techniques, as well as epitaxial growth techniques, which are well-known in the art, may be employed to form the various layers and/or structures in accordance with the present invention. In a preferred embodiment, the pillar-forming resin material is a positive photoresist, which is uniformly flooded by light prior to deposition of positive photoresist used as lens-forming thermoplastic resin. In this case, the pillar is formed automatically during the photolithographic formation of the columnar lens-forming structure. Some reflow of the pillar can occur during the formation of the microlens, which can further enhance the restriction of the microlens area.

It is an object of the present invention to describe a method of forming microlenses with a shape optimal for maximizing the external quantum efficiency of an underlying light emitter or for improving the beam shape of an underlying light emitter.

It is a further object of the present invention to describe a method of forming microlenses which are elevated with respect to the substrate by means of a pillar of predetermined height. The focus distance of the lens can be adapted to correspond with the position of the active layer of an underlying optoelectronic device.

It is a further object of the present invention to describe a method of forming microlenses, the pillar of which planarizes an underlying substrate by pillar-forming resin layers before the lens is formed.

It is a further object of the present invention to describe a method of forming microlenses which can be precisely aligned on an underlying optoelectronic device such as a light emitter (LED, laser, photothyristor), a light detector (MSM detector, photodiode, phototransistor, photothyristor, CCD), or a sensor.

It is a further object of the present invention to describe a method of forming microlenses, the reflow characteristics of which are fairly independent of the substrate material. Using said method the reflow properties are determined by the interface between the columnar resin structure and the pillar, and not by the interface between the pillar and the substrate. Hence, the "footprint" of the lens can be allowed to cover a processed device such as an LED or a CCD comprising various materials such as glass, a semiconductor, insulators, or metal layers. Here, the term "footprint" refers to the cross-sectioned area of the lens which is in contact with the pillar.

It is another object of the present invention to describe a method of forming microlenses with an ellipsoidal shape, having a curved surface which is a substantial portion of a complete ellipsoid, by confining the reflow of the resin to an area smaller than the footprint of the columnar structure before reflow. The thus-formed ellipsoidal dome covers a larger portion of an ellipsoid than microlenses described in prior art.

It is a further object the present invention to describe a method of forming microlenses which are part of an array of microlenses, each of which can be precisely aligned on an underlying optoelectronic device.

BRIEF DESCRIPTION OF THE DRAWINGS

The above and other aspects, features and advantages of the present invention will be more apparent from the following more particular description thereof, presented in conjunction with the following drawings therein.

a) photo taken after completion of the complete structure, before reflow (step G of FIG. 1)

b) photo taken after reflow (step H of FIG. 1)

c) characteristics of the ellipsoidal lens

Figure 3A:
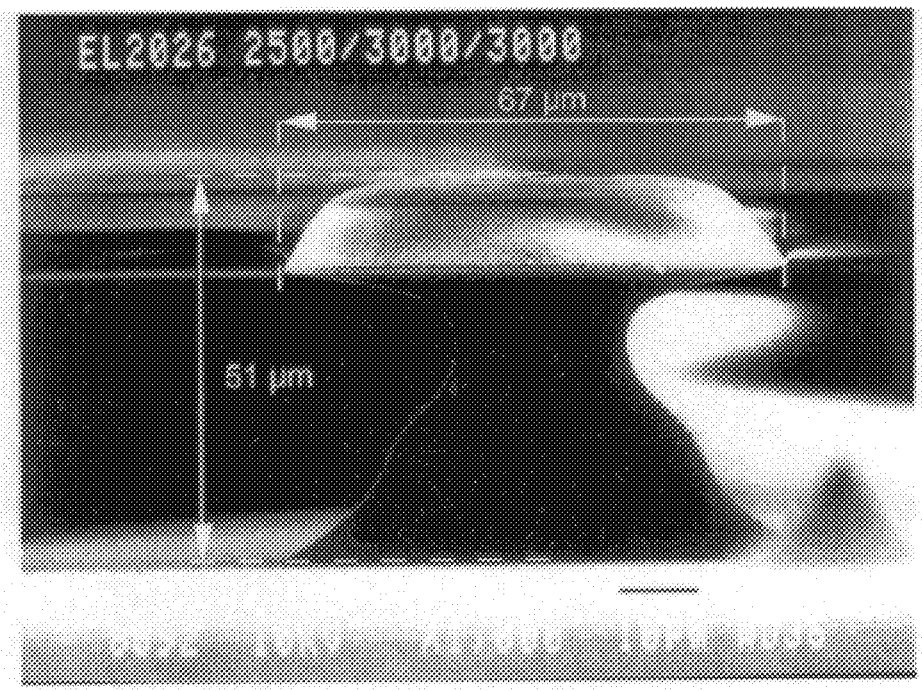
Figure 3B:
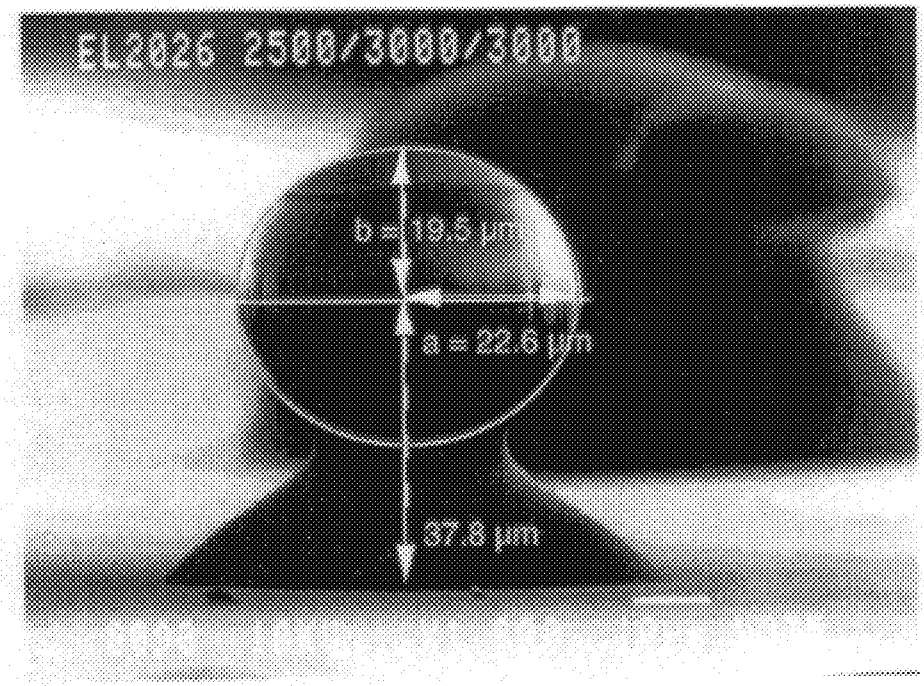

FIG. 3 show two Scanning Electron Microscope photo's of a three-layer photoresist lens produced with Morton EL2026 positive photoresist. The first layer is spun at 2500 rpm and flooded with 420 mJ/cm$^2$ and the second layer is spun at 3000 rpm and flooded with 420 mJ/cm$^2$; the first and second layer are for the formation of the pillar; the third layer is spun at 3000 rpm and illuminated with typically 1000 mJ/cm$^2$ and is for the formation of the lens. The footprint of the lens on the mask is 67 μm.

a) photo taken after completion of the complete structure, before reflow (step G of FIG. 1)

b) photo taken after reflow (step H of FIG. 1) and characteristics of the ellipsoidal lens FIG. 4 shows two Scanning Electron Microscope photo's of a two-layer positive photoresist lens produced with Morton EL2026 positive photoresist. The first layer is for the pillar, and the second layer is to form the lens. The footprint of the lens on the mask is 90 μm.

a) photo taken after completion of the lens (step H of FIG. 1)

b) characteristics of the lens

Figure 5:
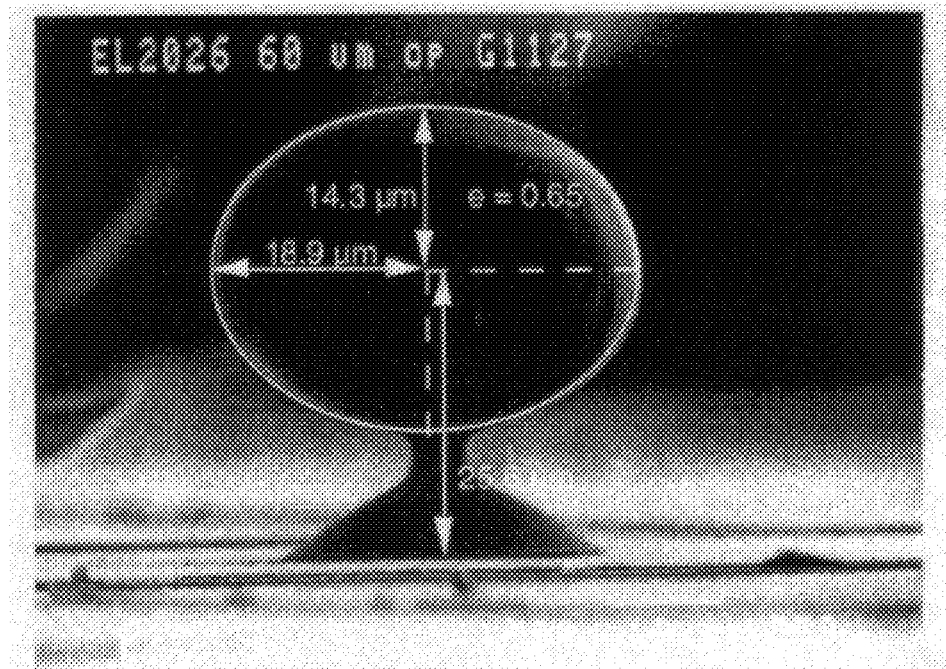

FIG. 5 shows a Scanning Electron Microscope photo of a two-layer positive photoresist lens produced with Morton EL2026 positive photoresist. The first layer is for the pillar, and the second layer is to form the microlens. The footprint of the lens on the mask is 60 μm. The characteristics of the ellipsoid microlens are indicated on the figure.

Figure 6:
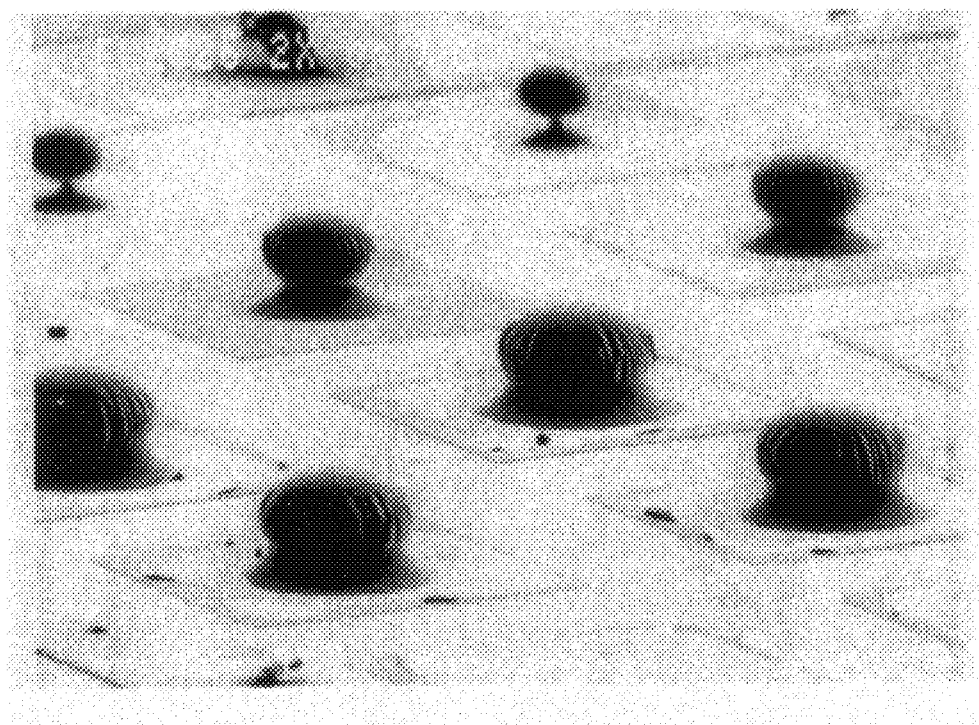

FIG. 6 shows a Scanning Electron Microscope photo of an array of lenses of 120 μm, 90 μm and 60 μm aligned on fully functioning Light-Emitting Diodes.

Figure 7A:
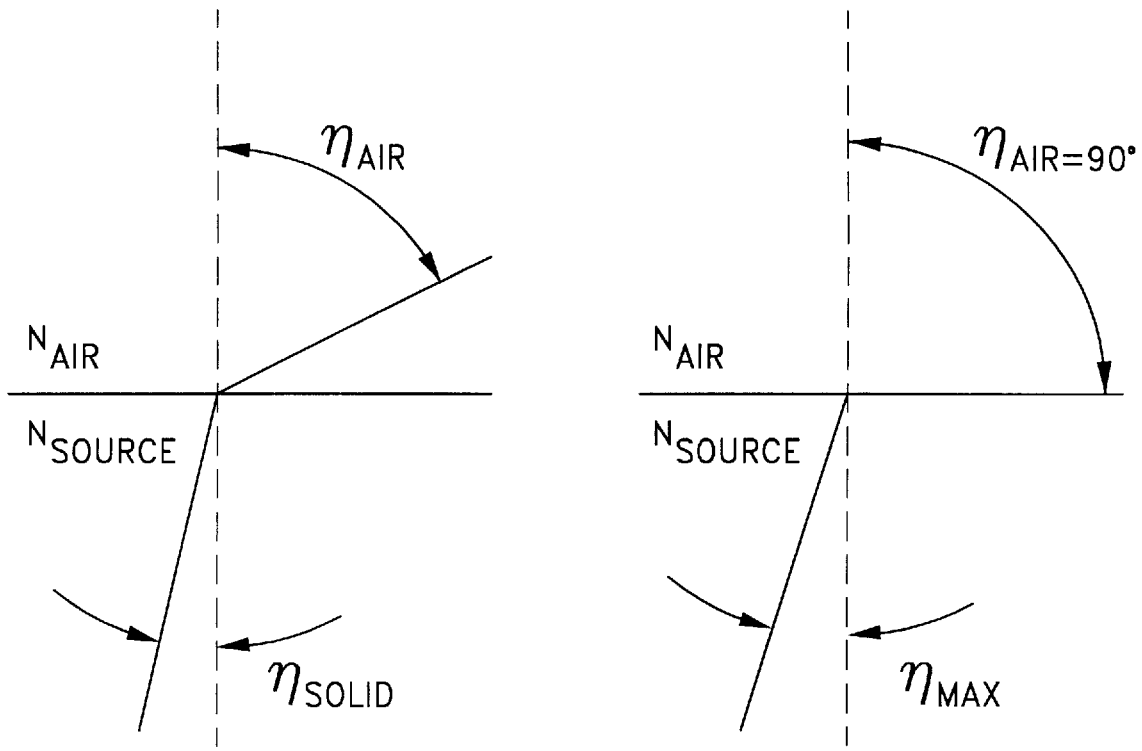

FIG. 7 shows: a) Maximum escape angle of photons from a medium with refractive index Nsource, when no microlens is present.

b) Definition of parameters of spherical microlens ideal to maximize the light output efficiency.

c) Definition of parameters of ellipsoid microlens ideal to maximize output efficiency in a parallel beam (10) perpendicular to the emitting surface.

Figure 9:
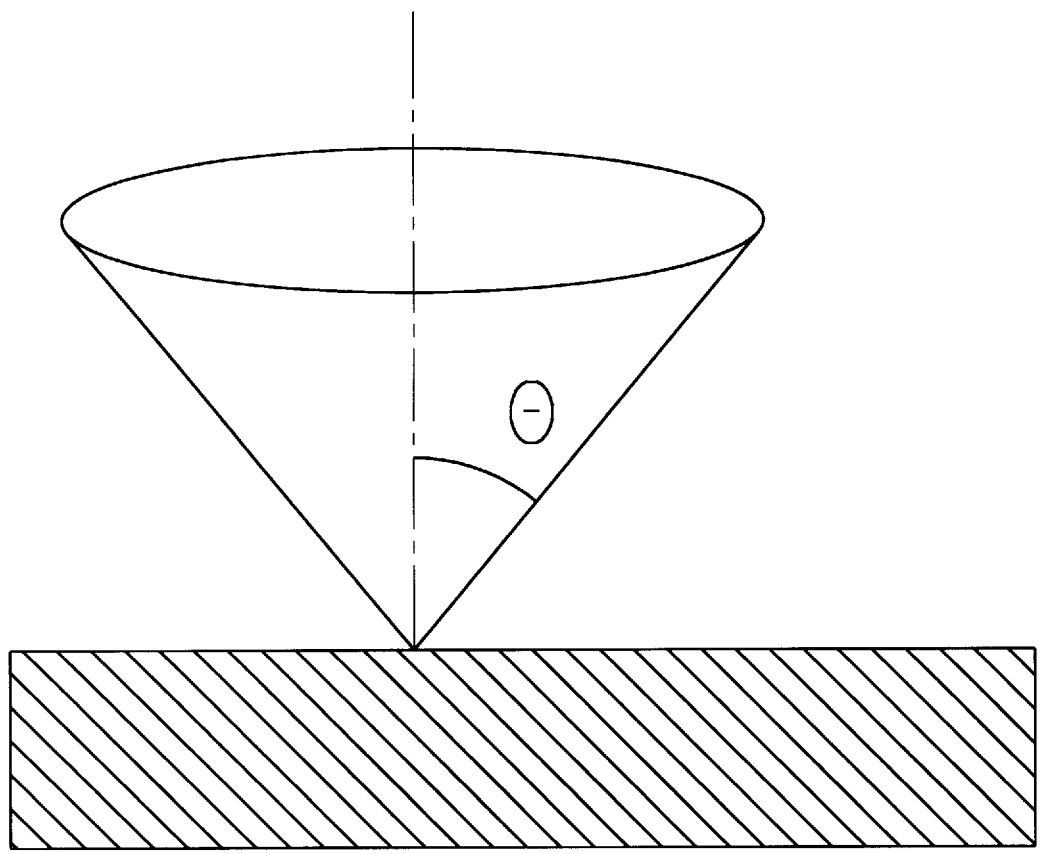

FIG. 8 shows: a) Free-space optical interconnect implemented with two lenses between an array of light emitters (11) and an array of light detectors (12).

b) Arrays of microlenses (13) and (14) collecting the light from light emitters (11) resp. focusing said light on the light-detectors (12) to render the set-up less critical, and permit more uniform operation.

c) Even better is adhesion of the microlenses (13) and (14) precisely on top of the light-emitters and the light-detectors. A suitable technology to implement this is the use of the proposed multilayer reflow technology. FIG. 9 is a schematic diagram defining efficiency =lightemitted in cone Θ light generated inside emitter with reference to the use of these terms in FIGS.10–18.

Figure 10:
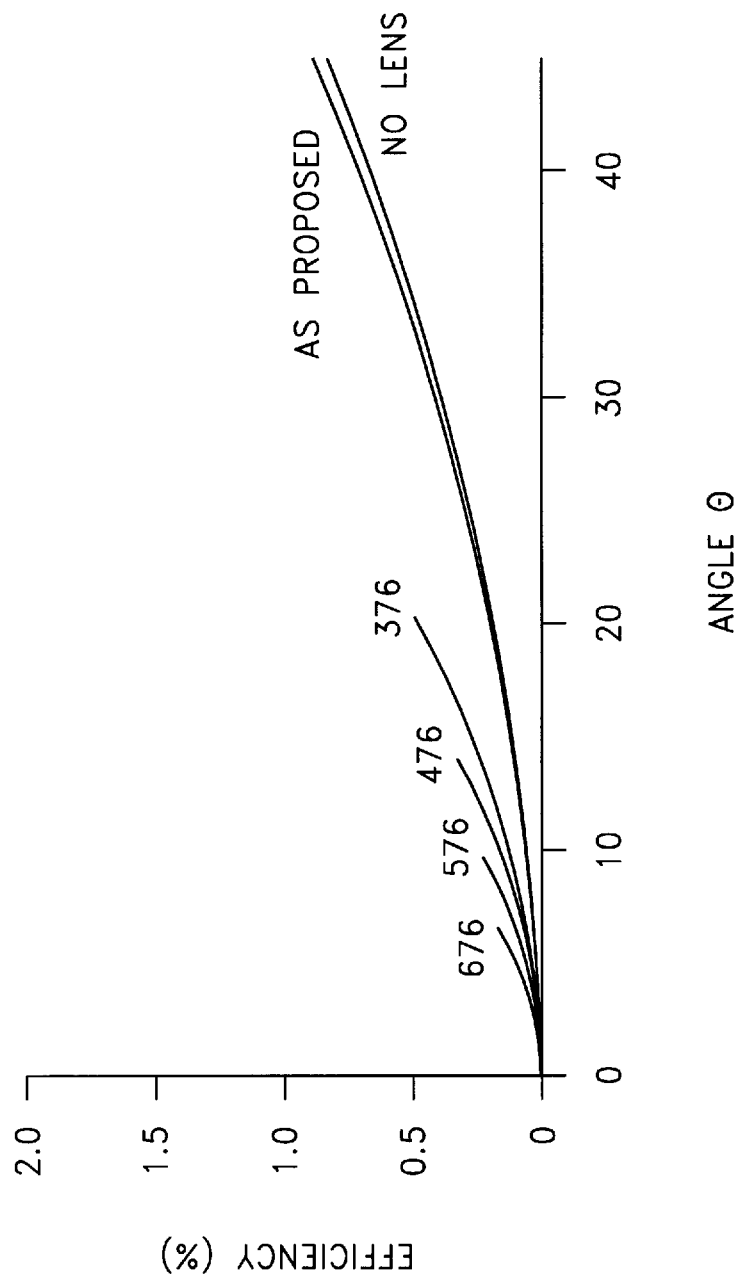

FIG. 10 is a graph of the theoretical efficiency of the microlense described in S. Haselbeck, et al., "Microlenses Fabricated By Melting A Photo Resist On A Base Layer," Optical Engineering Vol. 32 No. 6, p.1322 (1993).

FIG. 11 is a chart of selected information from the graph of FIG. 10.

Figure 12:
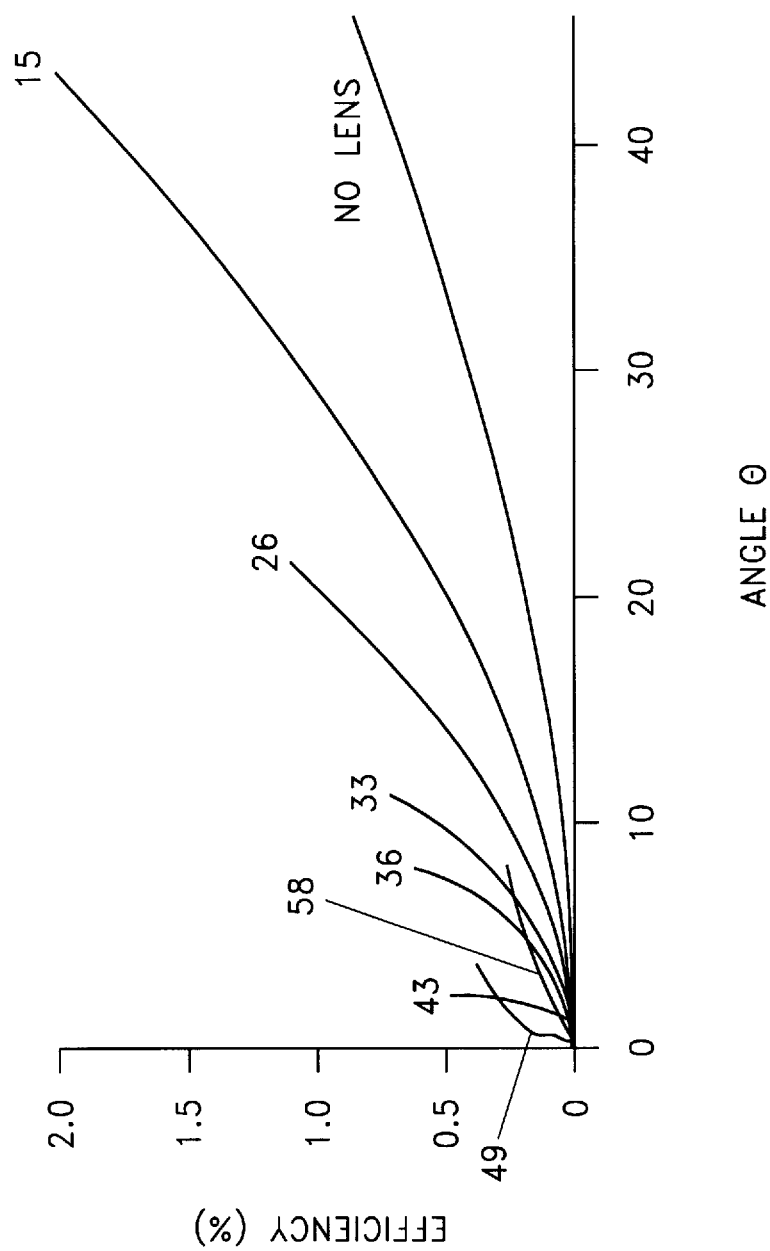

FIG. 12 is a graph of the theoretical efficiency of the microlenses described in Popovic, et al.., "A Process For Monolithic Fabrication Of Microlenses On Integrated Circuits," SPIE Vol. 898, p.23 (1988) and also in U.S. Pat. No. 4,689,291.

FIG. 13 is a chart of selected information from the graph of FIG. 12.

Figure 14:
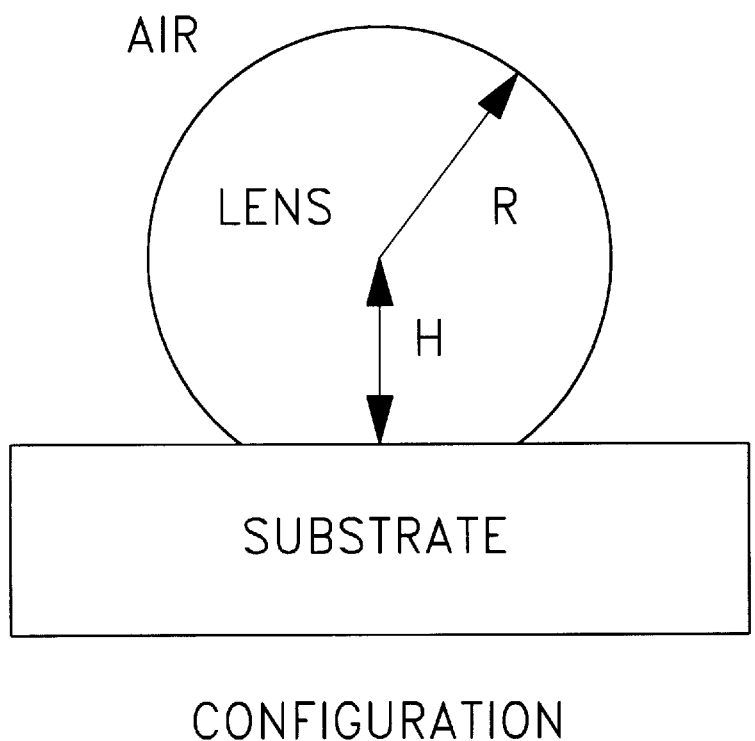
Figure 15:
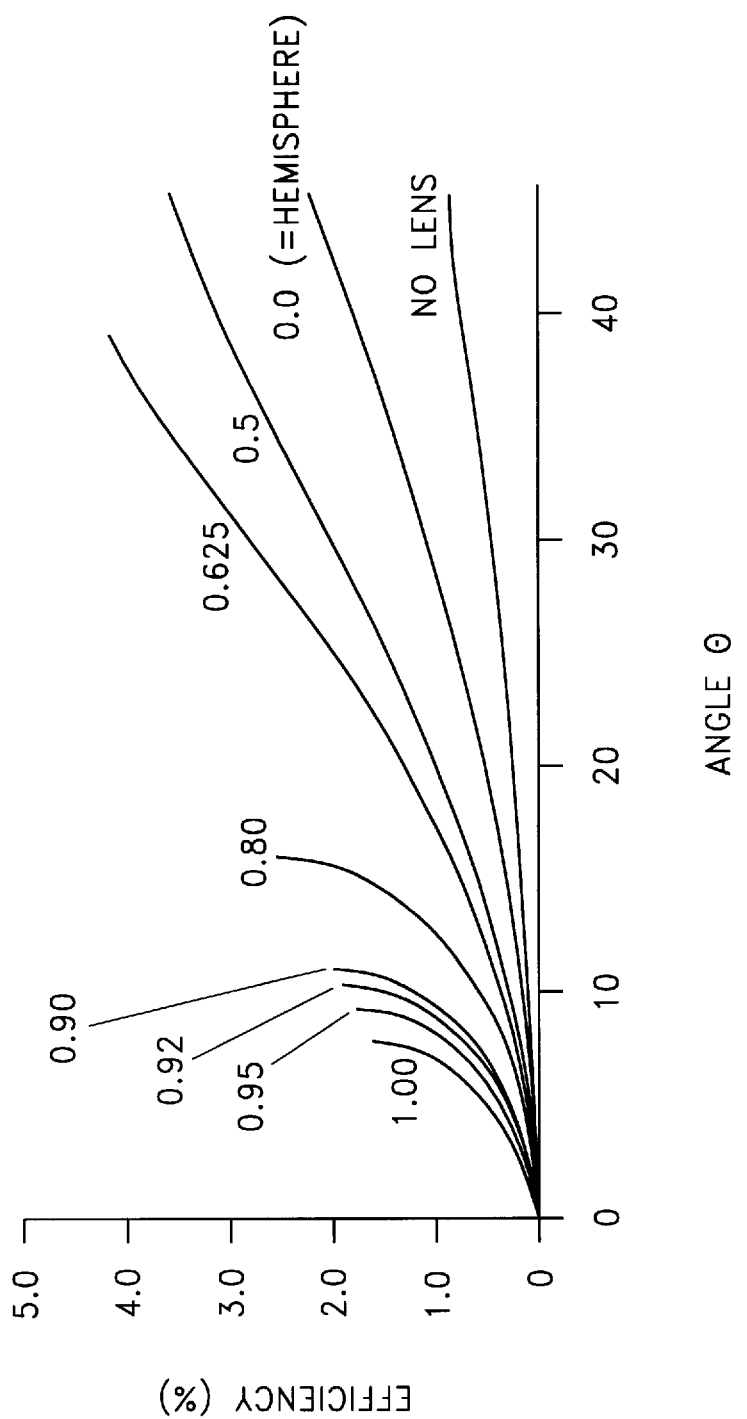

FIG. 14 defines the height ("H") and radius ("R") of a sperical lens on a substrate as those terms are used in FIGS. 15 and 16.

FIG. 15 is a graph of the theoretical efficiency of spherical lenses.

FIG. 16 is a chart of selected information from the graph of FIG. 15.

Figure 17:
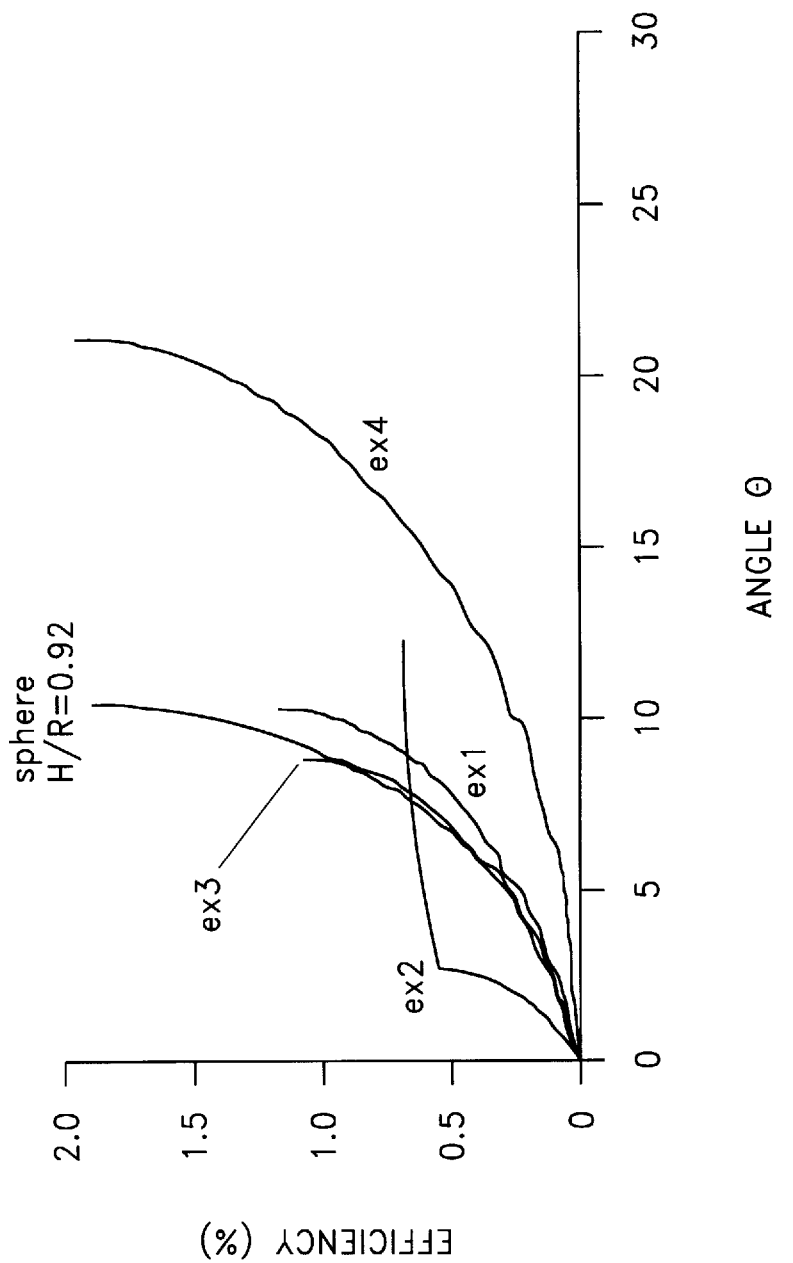

FIG. 17 is a graph of the theoretical efficiency of 4 fabricated lenses and of a lens with optimum efficiency in a 10° output angle.

FIG. 18 is a chart of selected information from the graph of FIG. 17.

DETAILED DESCRIPTION OF THE PREFERRED EMBODIMENTS

The invention will be described below in some detail, with reference to a microlens made of positive photoresist, which is a preferred embodiment. Yet, it is understood that many alternatives will be apparent to the person skilled in the art, the spirit and scope of the present invention being limited only by the terms of the appended claims.

With reference to FIG. 1, there is a substrate (6) in which optoelectronic devices may have been processed. The present invention describes a new method of forming microlenses, formed separately or in an array directly on this substrate and aligned on eventual underlying optoelectronic devices. With reference to FIG. 1A, a first transparent layer, preferably of resin (1), is deposited, possibly in several layers, until a desired thickness is achieved. If required for subsequent formation of a pillar, the layer stack is uniformly flooded by light as shown in FIG. 1B. This is for example the case if a positive photoresist is used as the resin. The procedure is repeated, until the desired pillar thickness is obtained. FIG. 1C and 1D show the complete first resin stack and possible light flooding.

Spin-coating can be employed to form the stack. However, it should be understood that other deposition techniques, as well as epitaxial growth techniques, which are well-known in the art may be used to form the stacks in accordance with the present invention.

Figure 1A:
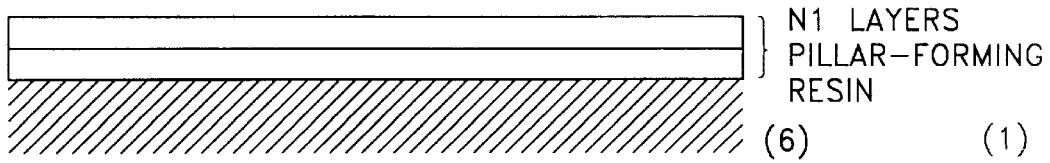
FIGS. 1A) to D) show the deposit of a first resin material (1) and flooding uniformly if necessary for subsequent pillar formation.
Figure 1B:
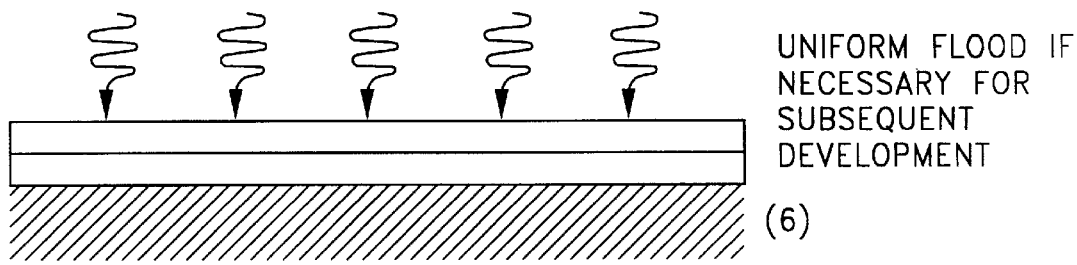
FIG. 1 is a schematic overview of the step-by-step formation of a microlens in accordance with the present invention.
FIGS. 1E) to G) show the deposit of a second resin (2), which forms a columnar structure (3) (for example by photolithography as shown in F) and a pillar (4) by using the column as a mask.
FIG. 1(H) shows the formation of a microlens (5) by reflow and solidification.
Figure 1C:
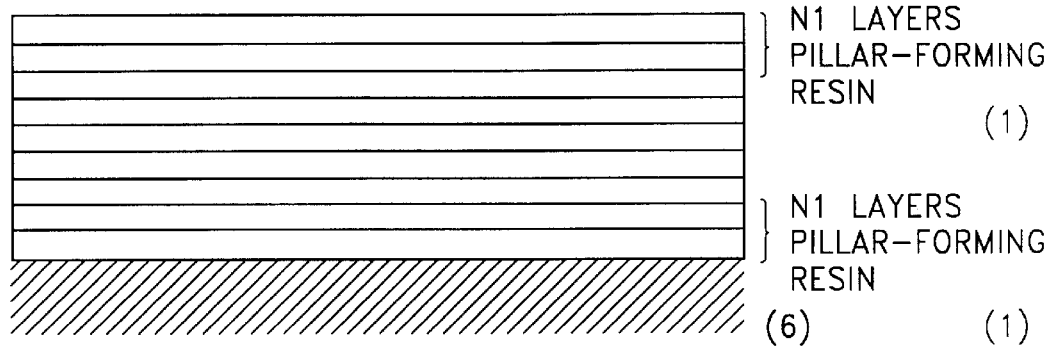
Figure 1D:
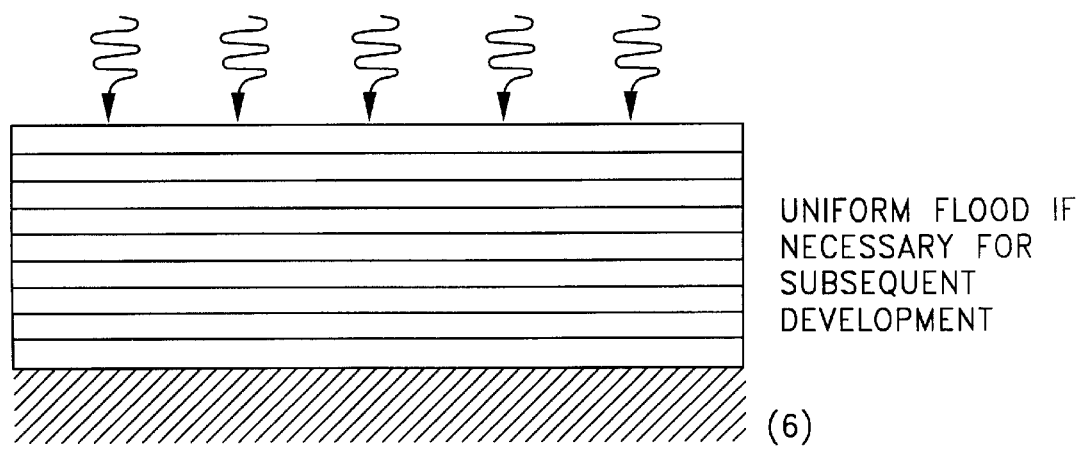
Figure 1E:
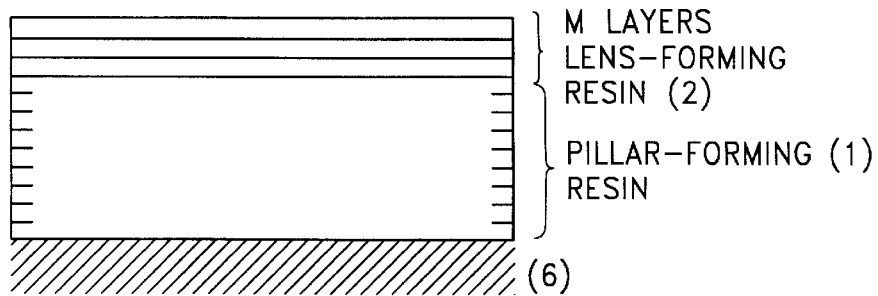
Figure 1F:
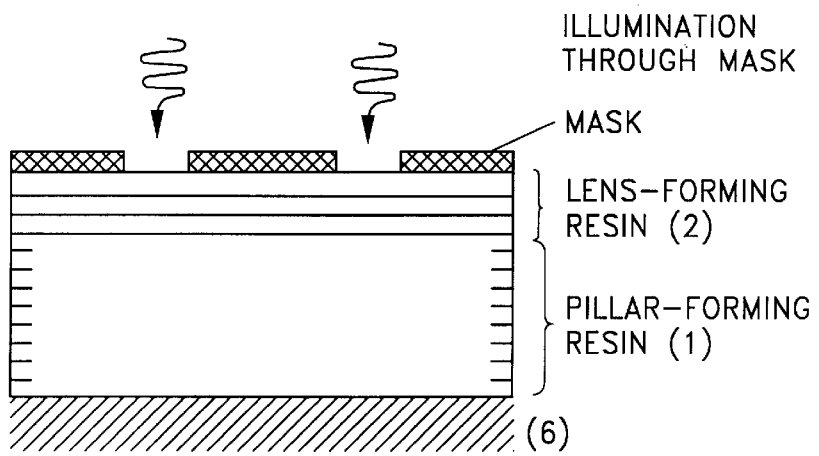
Figure 1G:
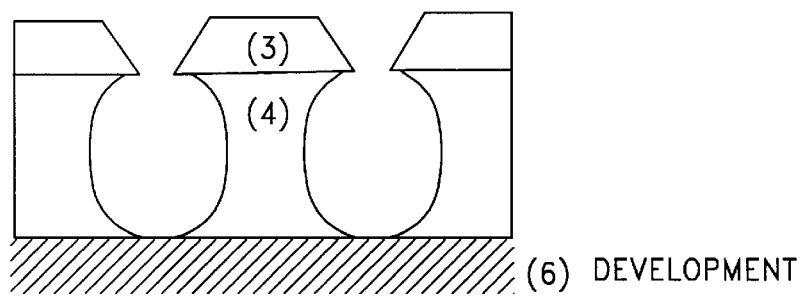
Figure 1H:
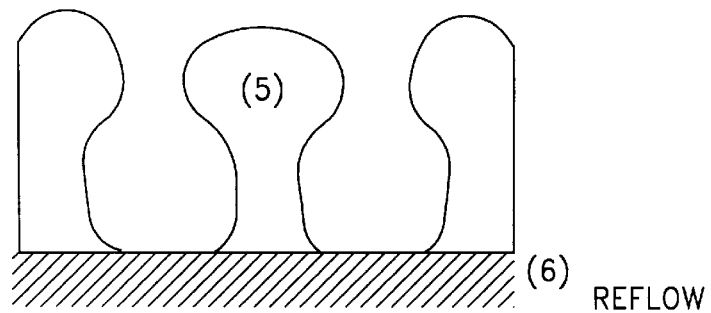

With reference to FIG. 1E, a second resin (2), which is thermoplastic, is deposited, eventually in several layers. Columnar structures (3) are formed, for example by lithography, as shown in FIG. 1F. Then, the pillar-forming resin (1) is etched using the columnar structure as mask to form a pillar (4) self-aligned under the columnar structure, and such that at the interface between the two resins, the cross-sectioned area, or footprint, of the pillar is smaller or equal to the footprint of the columnar structure (FIG. 1G). The microlens-forming columnar structure is then heated to its reflow temperature and cooled back to room temperature. Said reflow temperature is defined as the characteristic temperature or temperature range within which the material of said lens-forming columnar structure is softening. Softening means that the material exhibits some characteristic plasticity allowing reflow of the material. Said reflow temperature can be lower than the melting temperature of the material.

During the reflow, the lens-forming resin is pulled by the surface tension into a ball on the area defined by the pillar. Said area is smaller than or equal to the original footprint of the columnar structure. Due to this, a microlens with strong curvature can be obtained.

The shape of the pillar determines the shape of the microlens; for instance, a cylindrical pillar gives rise to a quasi-hemispherical microlens. The increase of the curvature persists and can even be enhanced if the pillar material reflows at the lens-forming temperature. The obtained microlenses have shorter focus distance and larger numerical aperture than those of prior art.

In a preferred embodiment, both the pillar-forming resin and the lens-forming resin are positive photoresists, possibly the same type of photoresist. Said resins should be transparent for the light emitted by the active device or for the light which should be sensed by the detectors integrated in the substrate. Provided the pillar-forming layers have been uniformly flooded with light as shown in FIG. 1B and FIG. 1D, it is then possible to form the pillars during the development of the lens-forming columnar structures. A process flow can then be described as:

1. Spin layer of positive pillar-forming photoresist and let dry;

Possibly repeat step 1 several times

2. Prebake;
3. Flood with light uniformly and let dry;

Possibly repeat steps 1+2+3 several times

4. Spin layer of positive lens-forming photoresist and let dry;

Possibly repeat step 4

5. Prebake;
6. Illuminate through patterning mask giving the footprint of the lens;
7. Develop the total photoresist layer structure; and
8. Reflow

Examples

A first example is shown in FIG. 2. It concerns a microlens consisting of three layers of photoresist. The photoresist was Morton EL2026. The process-flow is:

1. Spin a layer of photoresist Morton EL2026 at 2500 rpm for 60 sec;

move so aligned;

Dry at room temperature for 40 h;

Prebake at 95° C. for 2.5 min.;

2. Flood with light : dose of 400 mJ/cm$^2$ to 800 mJ/cm$^2$ (not critical);

Dry at room temperature for 24 h;

Dry at 35° C. to 40° C. for 24 h;

3. Spin second layer of photoresist EL2026 at 3000 rpm for 60 sec;

Dry at room temperature for 24 h;

Prebake at 95° C. for 3 min.;

4. Flood with light : dose of approximately 400 mJ/cm² (not critical);

Dry at room temperature for 20 h;

Dry at 35° C. to 40° C. for 24 h;

5. Spin third layer of photoresist EL2026 at 3000 rpm for 80 sec;

Dry at room temperature for 24 h;

Prebake at 95° C. for 15 min;

6. Illuminate through patterning mask giving the footprint of 90 µm diameter for the lens. Typical illumination exposure dose:1000 mJ/cm²;

7. Develop the total photoresist layer structure:

Developer AZ-MF 529 and water in ratio 1:3 for approximately 3'00"; and

Figure 2A:
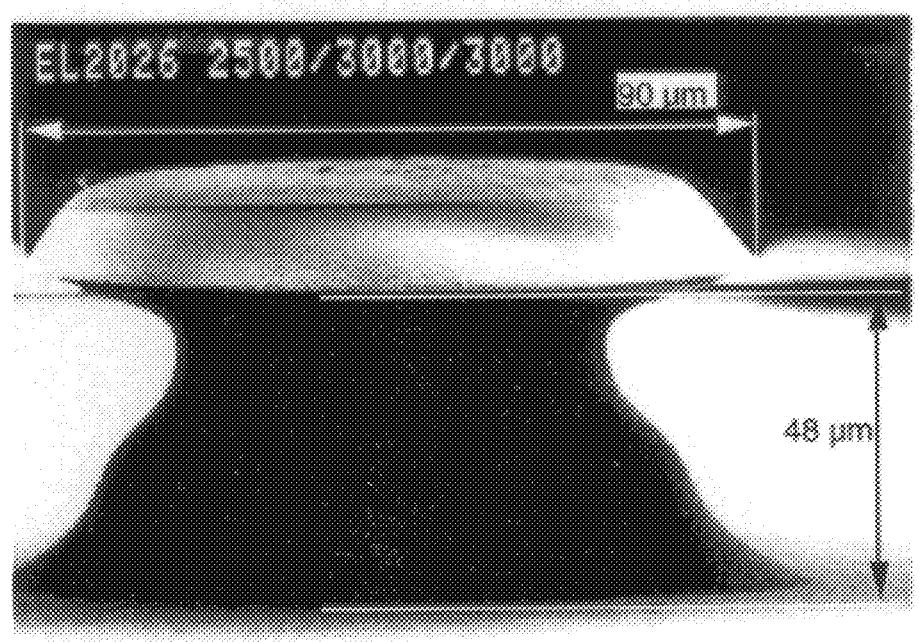
FIG. 2 shows three Scanning Electron Microscope photo's of a three-layer photoresist microlens produced with a Morton EL2026 positive photoresist. The first layer is spun at 2500 rpm and flooded with 420 mJ/cm$^2$); the second layer is spun at 3000 rpm and flooded with 420 mJ/cm$^2$; the first and the second layer are for the formation of the pillar; the third layer is spun at 3000 rpm and illuminated with typically 1000 mJ/cm$^2$ and is for the formation of the lens. The footprint of the lens on the mask is 90 μm.
Figure 2B:
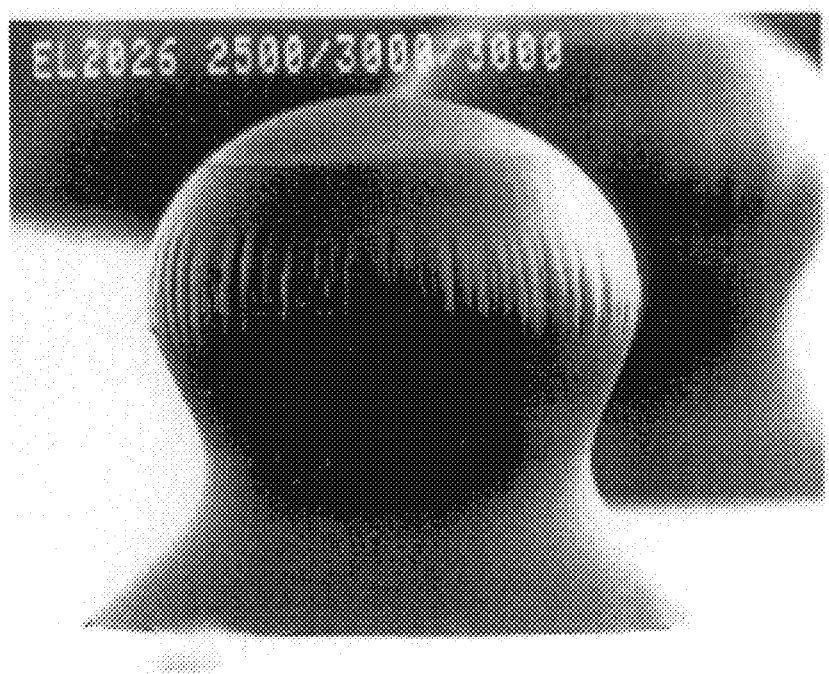
Figure 2C:
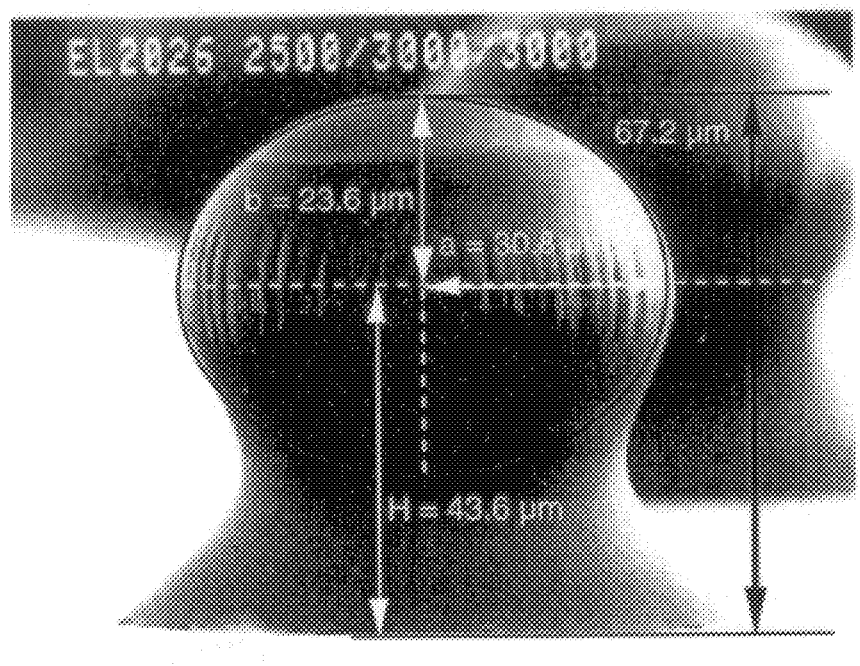

8. Reflow at 90° C. for 5 min;

FIG. 2a is the Scanning Electron Microscope photo after completion of step 7 above. It shows that the two first layers of photoresist, uniformnly flooded with light, develop during step 7 where they are exposed to the developer. FIG. 2b is after the reflow step 8. The characteristics of the lens obtained are extracted in FIG. 2c.

A second example is shown in FIG. 3. The process is the same as above, only the footprint of the lens on the mask was smaller (60 µm), resulting in a different microlens shape. A third example of the use of the proposed process is shown in FIG. 4. It concerns a two-layer photoresist microlens. The photoresist was Morton EL2026. The process flow is:

1. Spin a layer of photoresist Morton EL2026 at 2500 rpm for 100 sec;

Dry at room temperature for 24 h;

Prebake at 95° C. for 5 min.;

2. Flood with light:dose of 400 mJ/cm² to 800 mJ/cm² (not critical);

Dry at room temperature for 24 h;

Dry at 35° C. to 40° C. for 24 h;

3. Spin second layer of photoresist EL2026 at 3000 rpm for 80 sec;

Dry at room temperature for 24 h;

Prebake at 95° C. for 15 min;

4. Illuminate through patterning mask giving the footprint 90 µm diameter for the lens (typical illumination exposure dose: 1000 mJ/cm²);

5. Develop the total photoresist layer structure:

Developer AZ-MF 529 and water in ratio 1:3 for 3'00"; and

6. Reflow at 90° C. for 5 min

Figure 4A:
Figure 4B:
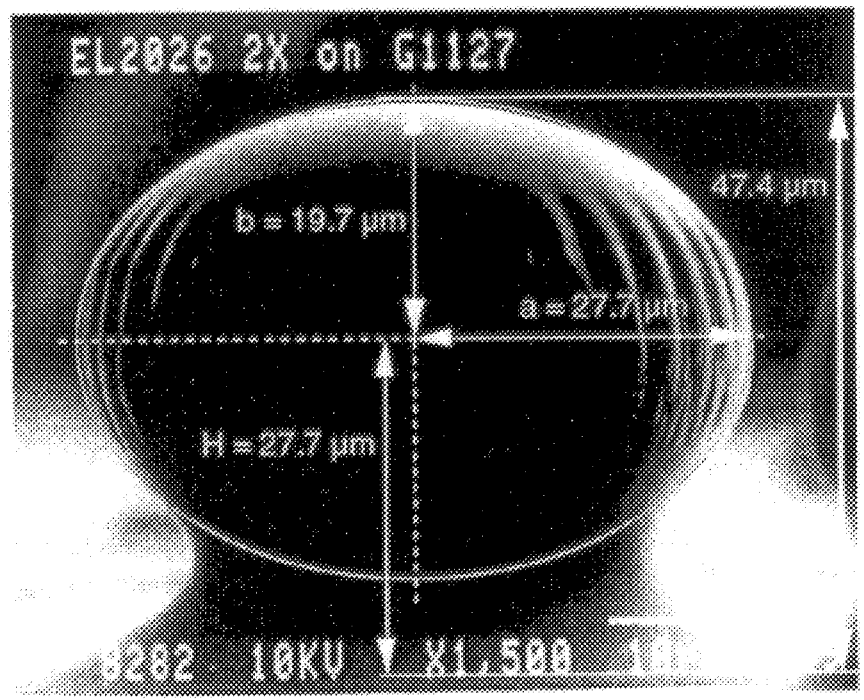

FIG. 4a shows the lens, the parameters of which are extracted in FIG. 4b.

A fourth example is shown in FIG. 5. The process is the same as that of FIG. 4, but the footprint on the mask was smaller (60 µm), resulting in a different shape for the microlens.

FIG. 6 shows two-level Morton photoresist EL2026 microlenses of several sizes fabricated on GaAs light-emitting diodes, and aligned on these underlying devices.

The typical microlens described by the present invention improves the external quantum efficiency of an underlying light-emitting diode, and also improves the diode's directionality, as shown below. Also, the method for fabricating microlenses according to the present invention is well-suited for integrating the microlenses on light emitters.

The microlenses fabricated according to this method have an enhanced external quantum efficiency and improved directivity of the emitted light. Microlenses can be manufactured with an ellipsoidal shape, i.e. having a curved surface which is a substantial portion of a complete ellipsoid, by confining the reflow of the resin to an area smaller than the footprint of the columnar structure before reflow. The thus-formed ellipsoidal dome covers a larger portion of an ellipsoid than microlenses described in prior art.

The microlenses can have a shape optimal for maximizing the external quantum efficiency or for improving the beam shape of an underlying light emitter. The microlenses can be elevated with respect to the substrate by means of a pillar of predetermined height. The focus distance of the lens can be adapted to correspond with the position of the active layer of an underlying optoelectronic device. The pillar of the thus-formed microlenses can planarize an underlying substrate by pillar-forming resin layers before the lens is formed. The thus-formed microlenses can be precisely aligned on an underlying optoelectronic device such as a light emitter (LED, laser, photothyristor), or a light detector (MSM detector, photodiode, phototransistor, photothyristor, CCD), or a sensor. The reflow characteristics of the microlenses formed according to this method are fairly independent of the substrate material, since the reflow properties are determined by the interface between the columnar resin structure and the pillar, and not by the interface between the pillar and the substrate. Hence, the footprint of the lens can be allowed to cover a processed device (such as an LED or a CCD) comprising various materials (glass, semiconductor, insulators, metal layers, . . .). Furthermore the thus-formed microlenses can be part of an array of microlenses, with each of the microlenses being precisely aligned on an underlying optoelectronic device.

Among the applications with the microlenses formed according to the present invention, one can mention a maximization of the outcoupling of light from a light-emitting diode. Solid-state light emitting devices (e.g. semiconductor light-emitting diodes) typically have a low external quantum efficiency, because the large difference between the refractive index of solids such as semiconductors (typically n=3.6) and air (n=1) strongly limits the escape angle for photons generated inside the solid as a result of Snell's law (FIG. 7a):

$$N_{max} = \frac{1 - \cos\left(\arcsin\left(\frac{N_{air}}{N_{source}}\right)\right)}{2}$$

For example, with n=3.6, the theoretical maximum external efficiency of the source is less than 2.0%.

The little light which can escape is distributed over all angles as a Lambertian source. In many applications, a parallel light beam is preferred over a divergent beam. To achieve this, a lens or lensset with numerical aperture N is placed in front of the source, at focus distance. As the source is Lambertian, such lens can only collect $N^2$ of the light. For example, for N=0.3, only 9% of the emitted light can be collimated into a parallel beam. Combining this with the external efficiency of 2.0%, the total efficiency of the system is only 0.18%.

Figure 7B:
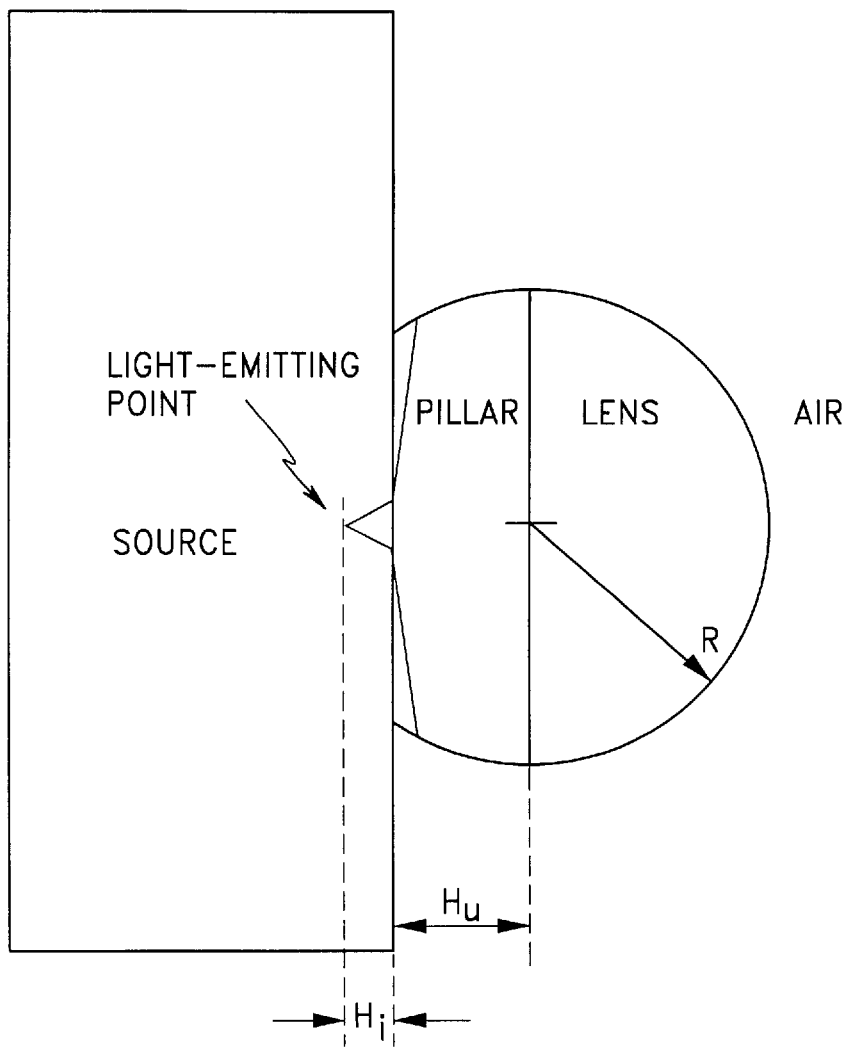

For optimizing the external quantum efficiency, a hemispherical lens must be positioned at a distance Hu above the light-emitting source, and such that the refractive index of the pillar supporting the lens is equal to that of the lens as shown in FIG. 7b (in other words, the lens must not be suspended in air above the source). The optimum Hu for maximum light output is:

$$H_u = \frac{n_{air}}{n_{lens}} R - \frac{n_{lens}}{n_{solid}} H_i$$

where R is the radius of the lens, Hi is the distance below the surface of the source (see FIG. 7b). Hi being negligible for most solid-state light sources, and photoresist materials having n≈1.6, this means that the lens must be suspended on a pillar of height equal to 0.63 times the radius of the lens. This cannot be achieved with the microlenses described in prior art. It can be achieved by means of the multiple-layer resin lenses proposed in the present patent application.

Figure 7C:
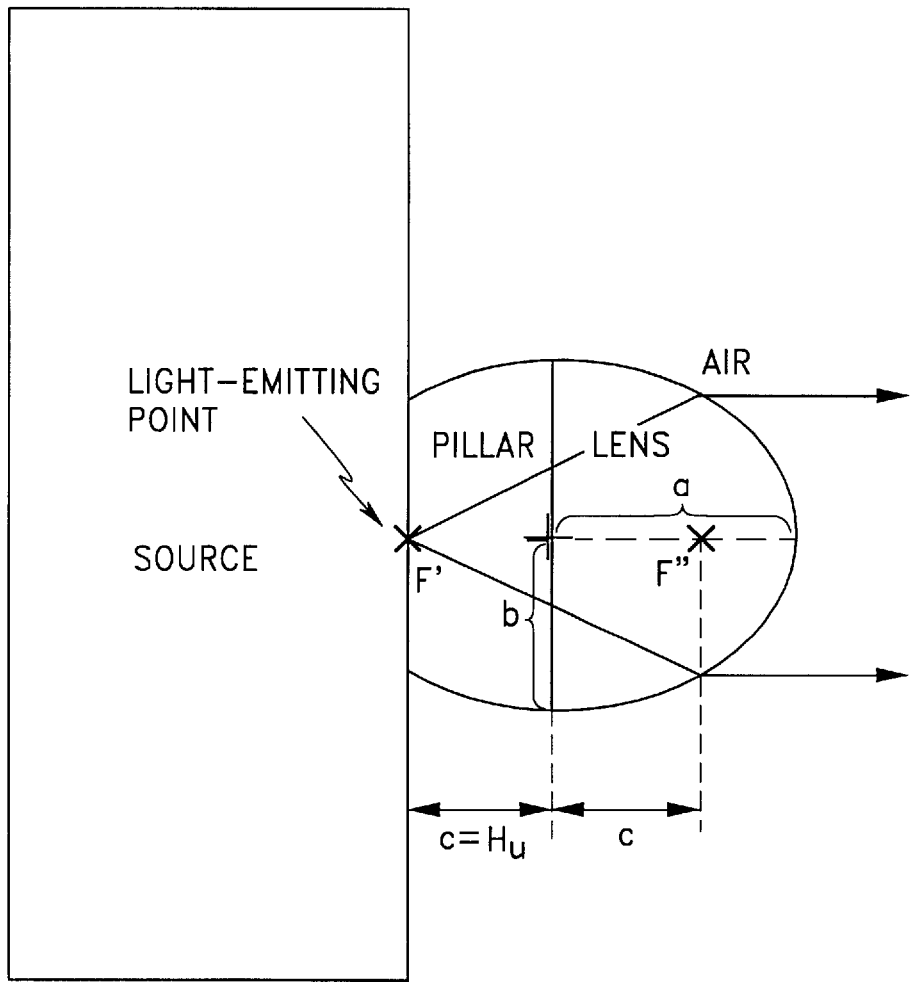

The above rule does not provide a collimated beam, but only maximizes the light output. If one neglects the depth Hi at which the light is generated below the surface, one can show that for optimum collimation the lens shape must be ellipsoidal, as shown in FIG. 7c. The eccentricity of this ellipsoid, defined as the ratio c/a, must be equal to $n_{air}/n_{lens}$. The value of a at the top of the lens is the same as R of the hemispherical lens defined for maximum light output (namely $Hu/a=c/a=_{air}n_{lens}$) and the value of b is:

$$b/a = \sqrt{1 - \left(\frac{c}{a}\right)^2} = \sqrt{1 - \left(\frac{n_{air}}{n_{lens}}\right)^2}$$

For $n_{lens}$≈1.6, the difference between a and b is about 12%. Prior-art microlenses cannot mimic this shape. The microlens proposed in the present patent, however, can be made to have the described shape.

Table 1 shows some calculations concerning the performance of microlenses integrated on a planar light-emitting diode. Shown are: a) the percentage of all photons which are emitted in a cone with an angle Θ perpendicular to the lens surface; b) a table giving the maximum angle of the cone in which photons are emitted, the maximum percentage of emitted photons in that cone, and the percentage of photons emitted in a cone with an angle of 10° to normal (these photons can be collected with a lens having a numerical aperture sin(10°)=0.17). Table 1a is for a typical prior-art microlens from the reference Haselbeck et al., "Microlenses fabricated by melting a photoresist on a base layer", Optical Engineering 32(6), pp. 1322 (1993). This lens is assumed to have been fabricated at a height H above a planar LED. The maximum light output in a cone of 10° is 0.228% of the generated photons; this result requires the microlens to be positioned at 576 μm above the active area of the LED. Table 1b is for the prior-art technique described in U.S. Pat. No. 4,689,291 (Z. D. Popovic). The maximum light output in a cone of 10° is 0.6% of the generated photons; this result requires the microlens to be positioned 36μm above the active area of the LED. Table 1c shows what is possible with a lens consisting of a portion of a sphere larger than a hemisphere and smaller than a full sphere. The maximum light output in a cone of 10% is 1.89% of the generated photons; this result requires the microlens with H/R=0.92 (see Figure). For each admitted cone, there exists an optimum spherical lens to yield a maximum efficiency, the maximum efficiency being limited to 4.25%. However, all these optimums require a lens consisting of more than a hemisphere. Table 1d shows the theoretical performance of the lenses shown in FIGS. 2 to 5 (example 1 to 4). Their performance readily exceeds those of prior-art techniques.

By varying the type of photoresist or the spin conditions, the ideal shape for concentrating the output light in a predefined cone can be obtained. The lens of FIG. 5 has been fabricated on top of a light-emitting diode with diameter of 20 μm. A factor of 8 improvement of the efficiency of the planar LED was obtained for small output angles (Θ≦10°). The improvement of the external quantum efficiency and of the beam shape is of direct use in all applications with solid-source light-emitters, such as: photocopy machines, light panels and displays, lights in automotive, computer industry, optical interconnects, etc.

Figure 8A:
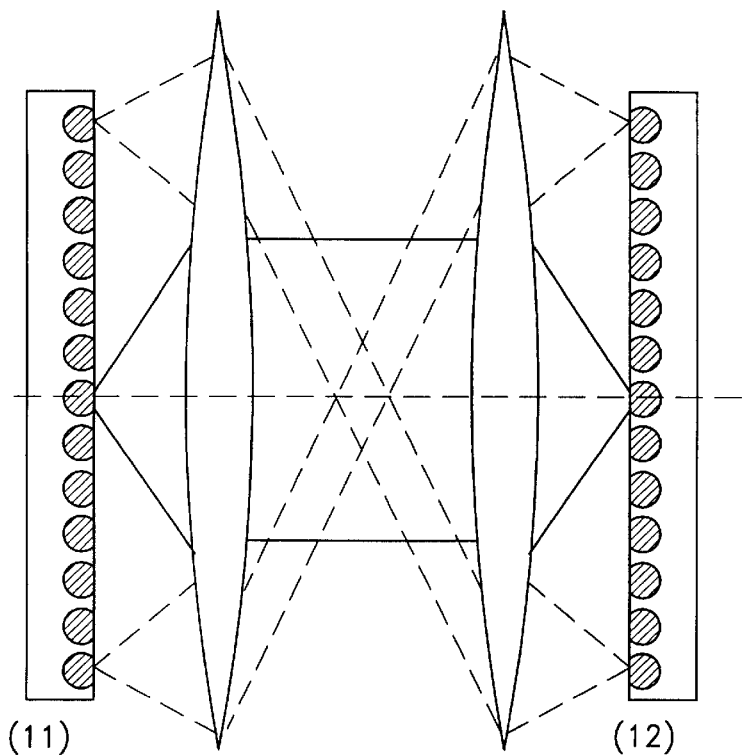

Among the applications of the microlenses formed according to the present invention, one can mention a microlens array combined with arrays of photodetectors or light-emitting devices Point-to-point imaging from a light-emitting plane to a receiver plane is a task required in many applications, such as optical interconnects, information technology, audio-visual services, photocopy machines, etc. The most simple way to achieve it is to place the emitter plane in the focal plane of a lens system, and to place a second lens system at focus distance from the receiver, as shown in FIG. 8a. The ratio of the focus distances corresponds to the magnification of the emitted image on the reception plane. This system has major drawbacks. A large lens with large numerical aperture is of bad quality in terms of aberrations. To limit them, the numerical aperture will be small, hence the amount of light collected from the emitters is small. Moreover, the amount of light collected depends on the position of the emitter with respect to the center of the lens.

Figure 8B:
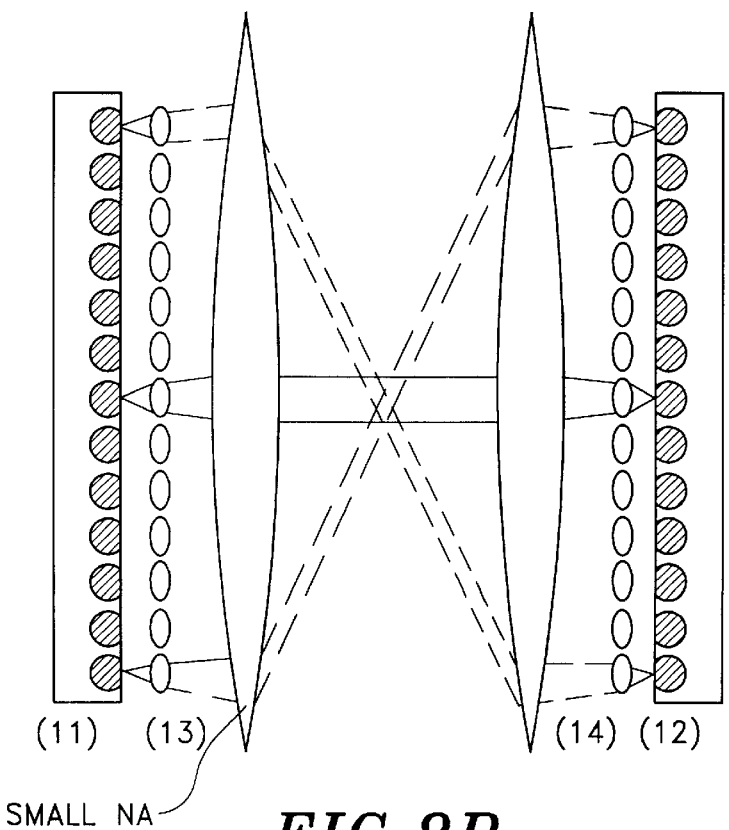

An improved method is to foresee lenslet arrays (13) and (14) aligned (and fixed) with respect to the emitter and receiver arrays (11) and (12), as shown in FIG. 8b. The light-emitters and light-detectors are placed at the focus distance of the combination of the lenslets (microlenses) and the large lens, such that again, the beams between the emitter system and the detector system are parallel. Because it is easier to make small lenses of good quality, the microlenses can have a large numerical aperture, and collect more light from the emitters. Also, the light collection is the same for all emitters of the array. The numerical aperture of the large lenses can be small, and therefore the tolerance on the alignment of these lenses with respect to the combination of emitters+lenslets and detectors+lenslets is large.

Figure 8C:
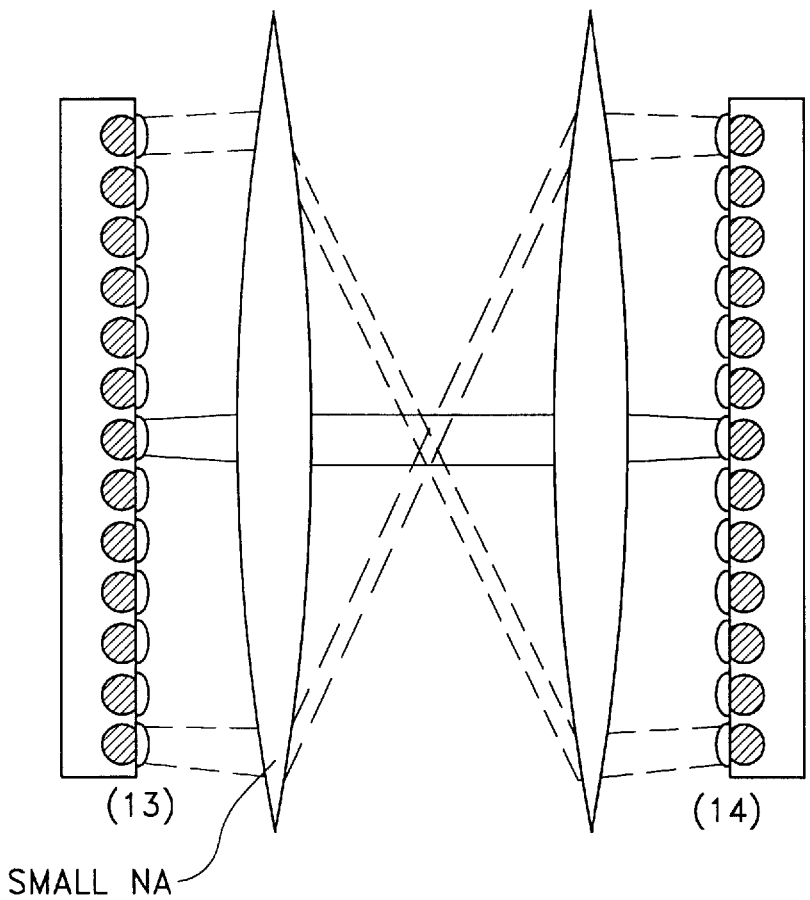

A practical way of making the lenslet arrays of FIG. 8b is using the multi-layer reflow lenses proposed in the patent, as shown in FIG. 8c. This technique ensures that the lenslets are fixed on top of the emitters and the detectors. The medium between the emitter and the lens, moreover, has a refractive index larger than air, which improves the quantum efficiency as compared to the set-up of FIG. 8c.

FIGS. 9–18 show the results of comparison of the theoretical and measured efficiencies of prior-art and of spherical microlenses with lenses fabricated according to the method described in the present patent application. It should be noted that in FIGS. 12, 15 and 17 some curves are bowing vertically. At this moment the simulation is stopped since the results are getting less reliable due to the effect of internal reflections.

What is claimed is:

1. A method of forming a refractive microlens, comprising the steps of:

forming one or more first transparent layers on a substrate;

forming one or more second transparent layers on said first transparent layer;

forming a columnar structure in said second transparent layer;

forming a pillar in said first transparent layer using said columnar structure as a mask; said pillar having a cross-sectional area at an interface bewtween said pillar and said columnar structure smaller than or equal to the cross-sectional area of said columnar structure at said interface;

reflowing said second transparent layer of said columnar structure while said pillar remains essentially unaltered, thereby forming a structure on top of said pillar, said microlens structure having a cross-sectional area not greater than the original cross-sectional area of said columnar structure; and solidifying said microlens structure.

2. The method of claim 1, wherein said first transparent layer is $SiO_2$ or $Si_3N_4$ or ZnSe or $InSnO_x$.

3. The method of claim 1, wherein said first transparent layer is a resin.

4. The method of claim 1, wherein said first transparent layer is a photoresist or polyimide.

5. The method of claim 4, wherein said pillar is formed in said photoresist by a sequence of a photolithographic step and a removal step using said columnar structure as a mask.

6. The method of claim 1, wherein said second transparent layer is a thermoplastic material.

7. The method of claim 6, wherein said thermoplastic material is a thermoplastic resin.

8. The method of claim 7, wherein said thermoplastic resin is a photoresist.

9. The method of claim 8, wherein said columnar structure is formed in said photoresist by a sequence of a photolithographic step and a removal step.

10. The method of claim 1, wherein during said formation of said columnar structure, said columnar structure is aligned with respect to an optoelectronic device formed in said substrate.

11. The method of claim 10, wherein the height of said pillar is adjusted with respect to the position of the active layer of said optoelectronic device in order to match the focus distance of said microlens with said position of said active layer.

12. The method of claim 10, wherein said microlens is one of a plurality of microlenses aligned on said optoelectronic device.

13. The method of claim 1, wherein the microlens has a large numerical aperture.

14. The method of claim 1, wherein the microlens shapes the output beam of optoelectronic emitters.

15. The method of claim 1, wherein said first transparent layer planarizes the substrate.

16. The method of claim 1, wherein:

said step of forming one or more first transparent layers is performed by depositing the one or more first transparent layers on said substrate; and said step of forming one or more second transparent layers is performed by depositing the one or more second transparent layers on the first transparent layer.

17. The method of claim 16, further comprising the step of flooding said first photoresist layer with light prior to said deposition of said second photoresist layer.

18. The method of claim 1, wherein said step of forming one or more first transparent layers is performed by growing the one or more first transparent layers on said substrate; and said step of forming one or more second transparent layers is performed by growing the one or more second transparent layers on the first transparent layer.

19. The method of claim 1, wherein said microlens structure formed on top of said pillar is of an ellipsoidal shape.

20. The method of claim 1, wherein said substrate is a semiconductor.

21. The method of claim 1, wherein during said reflow said microlens structure is formed to have a shape which is at least half of either an ellipsoid or a sphere.

22. A method of forming a refractive microlens comprising the steps of:

forming one or more first photoresist layers on a substrate;

forming one or more second photoresist layers on said first transparent layer;

patterning by photolithogrtaphic techniques a columnar structure in said second photoresist layer;

patterning by photolithographyic techniques a pillar in said first photoresist layer using said columnar structure as a mask, thereby self-aligning said pillar under said columnar structure;

reflowing said second photoresist layer of said columnar structure while said pillar remains essentially unaltered, thereby forming a microlens structure on top of said pillar, said microlens structure having a ground plane with an area smaller than or equal to the original cross-sectional ground plane area of said columnar structure; and solidifying said microlens structure.

23. The method of claim 22, wherein said substrate is a semiconductor.

24. The method of claim 22, wherein said microlens structure has an ellipsoidal shape.

25. The method of claim 22, wherein:

said step of forming one or more first photoresist layers is performed by depositing the one or more first photoresist layers on said substrate; and said step of forming one or more second photoresist layers is performed by depositing the one or more second photoresist layers on the first photoresist layer.

26. A method of forming a refractive microlens, comprising the steps of:

spinning a layer of positive pillar-forming photoresist on a substrate;

heating the pillar-forming layer;

flooding the pillar-forming layer uniformly with light;

spinning a layer of positive lens-forming photoresist on the pillar-forming layer;

heating the lens-forming layer;

illuminating the lens-forming layer through a pattern mask;

developing the total photoresist layer structure;

reflowing the positive lens-forming photoresist.

27. A method of forming a refractive microlens, comprising the steps of:

forming one or more first transparent layers on a substrate;

forming one or more second transparent layers on said first transparent layer;

thereafter, a forming a columnar structure in said second transparent layer;

forming a pillar in said first transparent layer using said columnar structure as a mask, said pillar having a cross-sectional area at an interface between said pillar and said columnar structure smaller than or equal to the cross-sectional area of said columnar structure at said interface;

thereafter, reflowing said second transparent layer of said columnar structure while said pillar remains essentially unaltered, thereby forming a microlens structure on top of said pillar, said microlens structure having a cross-sectional area not greater than the original cross-sectional area of said columnar structure; and solidifying said microlens structure.

* * * * *

UNITED STATES PATENT AND TRADEMARK OFFICE
CERTIFICATE OF CORRECTION

PATENT NO. : 5,871,888
DATED : February 16, 1999
INVENTOR(S) : Paul Heremans, Gustaaf Borghs It is certified that error appears in the above-identified patent and that said Letters Patent is hereby corrected as shown below:

Column 11, claim 1,
Line 9, change "forming a structure" to -- forming a microlens structure --

Column 12, claim 27,
Line 63, change "a forming" to -- forming --

Signed and Sealed this

Second Day of April, 2002

Attest:

JAMES E. ROGAN
*Attesting Officer*     *Director of the United States Patent and Trademark Office*